(12) United States Patent
Venkatraman

(10) Patent No.: US 11,888,060 B2
(45) Date of Patent: Jan. 30, 2024

(54) POWER MOSFET WITH IMPROVED SAFE OPERATING AREA

(71) Applicant: SEMICONDUCTOR COMPONENTS INDUSTRIES, LLC, Phoenix, AZ (US)

(72) Inventor: Prasad Venkatraman, Gilbert, AZ (US)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 328 days.

(21) Appl. No.: 17/446,672

(22) Filed: Sep. 1, 2021

(65) Prior Publication Data

US 2023/0065659 A1    Mar. 2, 2023

(51) Int. Cl.
*H01L 29/78*    (2006.01)
*H01L 29/66*    (2006.01)
(Continued)

(52) U.S. Cl.
CPC ...... *H01L 29/7813* (2013.01); *H01L 29/1095* (2013.01); *H01L 29/42368* (2013.01); *H01L 29/66712* (2013.01)

(58) Field of Classification Search
CPC .......... H01L 21/8222; H01L 21/82285; H01L 21/8232; H01L 21/8234; H01L 21/823487;
(Continued)

(56) References Cited

U.S. PATENT DOCUMENTS

| 10,651,276 B2* | 5/2020 | Nishiwaki ........... H01L 29/1095 |
| 2003/0034522 A1 | 2/2003 | Klodzinski |
| 2019/0006357 A1 | 1/2019 | Ouvrard et al. |

FOREIGN PATENT DOCUMENTS

| DE | 102019005973 A1 | 3/2020 |
| WO | 2014149047 A1 | 9/2014 |

OTHER PUBLICATIONS

Mo-Huai Chang et al., "Optimizing the Trade off Between the RDS(on) of Power MOSFETs and Linear Mode Perfomance by Local Modification of MOSFET Gain", Proceedings of the 2016 28th International Symposium on Power Semiconductor Devices and ICs (ISPSD), Jun. 12-16, 2016, Prague, Czech Republic, pp. 379-382.

* cited by examiner

*Primary Examiner* — Julio J Maldonado
*Assistant Examiner* — Eric Manuel Mulero Flores
(74) *Attorney, Agent, or Firm* — Brake Hughes Bellermann LLP

(57) ABSTRACT

A MOSFET device die includes an active area formed on a semiconductor substrate. The active area includes a first active area portion and a second active area portion. At least one mesa is formed in the semiconductor substrate extending in a longitudinal direction through the active area. The at least one mesa includes a channel region extending in a longitudinal direction. The channel region includes low threshold voltage channel portions and high threshold voltage channel portions. The first active area portion includes the channel portions in a first ratio of low threshold voltage channel portions to high threshold voltage channel portions, and the second active area portion includes channel portions in a second ratio of low threshold voltage channel portions to high threshold voltage channel portions. The first ratio is larger than the second ratio.

20 Claims, 6 Drawing Sheets

(51) Int. Cl.
*H01L 29/423* (2006.01)
*H01L 29/10* (2006.01)

(58) Field of Classification Search
CPC . H01L 21/8238; H01L 21/8249; H01L 21/84; H01L 27/085; H01L 27/0886; H01L 27/092; H01L 27/0922; H01L 27/1022; H01L 27/1027; H01L 27/1211; H01L 29/06; H01L 29/0684; H01L 29/0692; H01L 29/08; H01L 29/1025; H01L 29/1095; H01L 29/365; H01L 29/70; H01L 29/72; H01L 29/73; H01L 29/739; H01L 29/7725
See application file for complete search history.

US 11,888,060 B2

POWER MOSFET WITH IMPROVED SAFE OPERATING AREA

TECHNICAL FIELD

This description relates to power MOSFET devices.

BACKGROUND

As semiconductor device (e.g., device cell dimensions) shrink, it is increasingly difficult manage the behavior or response of device elements to applied voltages and current conditions. The semiconductor device can suffer damage if operated outside a tight range of safe operating voltages and currents.

SUMMARY

In a general aspect, a MOSFET device die includes an active area. The active area includes a first active area portion and a second active area portion formed on a semiconductor substrate. At least one mesa is formed in the semiconductor substrate extending in a longitudinal direction through the active area. The at least one mesa includes a channel region extending in the longitudinal direction. The channel region is associated with at least a device (gate) channel. The channel region includes low threshold voltage channel portions and high threshold voltage channel portions. The first active area portion includes the channel portions in a first ratio of low threshold voltage channel portions to high threshold voltage channel portions, and the second active area portion includes channel portions in a second ratio of low threshold voltage channel portions to high threshold voltage channel portions. The first ratio is larger than the second ratio.

In a general aspect, a method includes forming a device die with an active area on a semiconductor substrate. The active area includes a first active area portion and a second active area portion. The method further includes forming at least one mesa in the semiconductor substrate extending in a longitudinal direction through the active area, and forming a channel region in the at least one mesa extending in the longitudinal direction. The channel region includes low threshold voltage channel portions and high threshold voltage channel portions. The first active area portion includes the channel portions in a first ratio of low threshold voltage channel portions to high threshold voltage channel portions, and the second active area portion includes channel portions in a second ratio of low threshold voltage channel portions to high threshold voltage channel portions. The first ratio is larger than the second ratio.

DESCRIPTION

Figure 1:
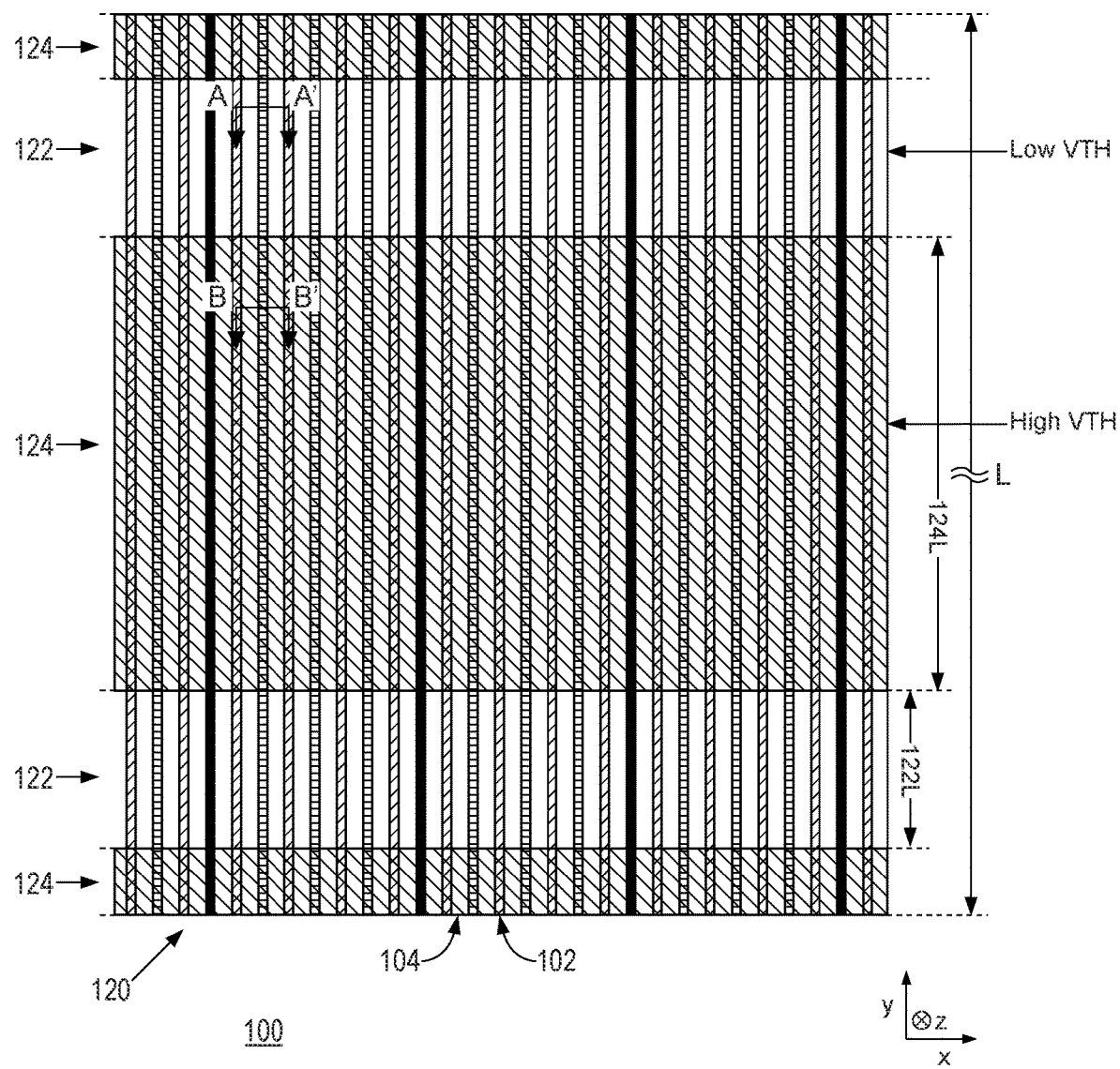
FIG. 1 illustrates, in plan view, a portion of an example device layout of a trench MOSFET device including an active area.

Metal oxide semiconductor field effect transistor (MOSFET) MOSFET devices are used in many power switching applications. In a typical MOSFET device, a gate electrode provides turn-on and turn-off control current flowing between a source terminal and a drain terminal in response to an applied gate voltage. For example, in an N-type enhancement mode MOSFET, turn-on occurs when a conductive N-type inversion layer (i.e., channel) is formed in a p-type body region in response to a positive gate voltage, which exceeds an inherent threshold voltage (VTH). The channel connects N-type source regions to N-type drain regions and allows for majority carrier conduction between these regions. The channel may be formed in the body region under the gate, for example, by a p-type high voltage (PHV) implant process. The PHV implant process parameters (e.g., dose, energy) may determine a value of the threshold voltage (VTH), which determines the current gain of the MOSFET.

In a trench MOSFET device, a gate electrode is formed in a trench that extends downward (e.g., vertically downward) from a major surface of a semiconductor material (also can be referred to as a semiconductor region) such as silicon. Further, a shield electrode may be formed below the gate electrode in the trench (and insulated via an inter-electrode dielectric). Current flow in a trench MOSFET device is primarily vertical (e.g., in an N doped drift region) and, as a result, device cells can be more densely packed. A device cell may, for example, include a trench that contains the gate electrode and the shield electrode. A mesa adjoining the trench contains the drain, source, body, and channel regions of the device.

An example trench MOSFET device may include an array of hundreds or thousands of device cells (each including a trench and an adjoining mesa). A device cell may be referred to herein as a trench-mesa cell because each device cell geometrically includes a trench and a mesa (or two half mesas) structures. Shield and gate electrodes may be formed inside of a linear trench running along (e.g., aligned along) a mesa. The shield and gate electrodes are also isolated from silicon in the mesa by dielectric layers (e.g., shield dielectric and gate oxide layers).

To ensure proper electrical contact of every cell, a "planar stripe" structure is often used for trench MOSFETS fabricated on a semiconductor die surface. In the planar stripe structure, a gate electrode ("gate") and a shield electrode ("shield poly") within a trench (e.g., a linear trench) are disposed to run along (e.g., aligned along) a length of the trench in a longitudinal stripe. The gate electrode (e.g., made with gate poly) is disposed along the length of the trench on top of (or above) the shield electrode (e.g., made with shield poly). The gate poly in the trench is exposed and contacted at a stripe end by a gate runner (e.g., gate metal) and the shield electrode (shield poly) in the trench is exposed and brought up to the surface (using a masking step) at a location along the length of the trench for contact by a source metal. Source regions in the mesas are exposed as source contact elements in a source contact area of the surface for contact by the source metal.

A current handling capability of a trench MOSFET device is determined by its gate channel (device channel) width. To minimize cost it may be important to keep the transistor's die area size as small as possible and increase the width of the channel surface area (i.e., increase the "channel density")

by creating cellular gate structures repeated over the whole area of a MOSFET die. A way to increase the channel density (and therefore increase channel width) is to reduce the size of the device cell and pack more device cells at a smaller pitch in a given surface area of the die. A total resistance between the drain and source (i.e., drain-source on resistance, RDS(on)) can be a basis for a maximum current rating of the MOSFET, and is also associated with power loss. All things being equal, the lower the $R_{DS(on)}$, the better the device performance. A value of threshold voltage $V_{TH}$ (which determines the turn-on and turn-off current) of the channels formed in the body region (PHV region) adjacent to the gate structures of the MOSFET may be determined by a p-type high voltage (PHV) implant process.

For a power semiconductor device (e.g., BJT, MOSFET, thyristor or IGBT), a safe operating area (SOA) is defined as the voltage and current conditions over which the device can be expected to operate without self-damage (e.g., caused by thermal instability).

SOA is usually presented in transistor datasheets as a graph or plot with $V_{DS}$ (drain-source voltage) on the abscissa and IDS (drain-source current) on the ordinate; the safe 'area' referring to the area under the curve. The SOA specification combines the various limitations of the device—maximum voltage, current, power, junction temperature, secondary breakdown—into one curve, allowing simplified design of protection circuitry. A MOSFET data sheet can, for example, include a SOA plot, which describes the maximum time a MOSFET can be exposed to a specific voltage and current. When both current and voltage are plotted on logarithmic scales, the borders of the SOA may be straight lines:

$I_D=I_D$max—current limit $V_{DS}=V_{DS}$max—voltage limit $I_D V_{DS}=P$max—dissipation limit, thermal breakdown.

SOA specifications may be useful to a design engineer for designing power circuits such as amplifiers and power supplies as they allow quick assessment of the limits of device performance, the design of appropriate protection circuitry, or selection of a more capable device. SOA curves are also important in the design of foldback circuits.

In many circuit applications (e.g., Hot Swap, fan controllers, linear amplifiers, etc.,) a MOSFET is operated in a linear mode in a saturation region of the on region characteristics (i.e., the drain current ($I_D$) versus drain-to-source voltage ($V_{DS}$) curves) of the device. Modern power MOSFET devices are more vulnerable to thermal runaway when operating in a linear mode (ohmic mode) due to the very high MOSFET gain required for the ultra-low RDS(on) requirements of the circuit applications.

The drain current ($I_D$) versus gate-to-source voltage ($V_{GS}$) curves may show a negative temperature coefficient region and a positive temperature coefficient region. Ideally, a MOSFET in a circuit should operate in the negative temperature coefficient region of the drain current ($I_D$) versus gate-to-source voltage ($V_{GS}$) curves (e.g., at high $V_{GS}$). Small changes in a distribution of $V_{TH}$ across the MOSFET device may cause localized hot spots in MOSFET operation. When there is a localized hot spot in the MOSFET operating in a negative temperature coefficient region, the current at that hot spot will decrease with increasing temperature to help cool that spot. When there is a localized hot spot in the MOSFET operating in a positive temperature coefficient region (e.g., at low $V_{GS}$), the current at that hot spot will increase with increasing temperature—causing further heating and possibly leading to thermal failure of the device.

The temperature at the local hot spots is also controlled by heat dissipation via device contact structures (e.g., source metal, gate contacts, heat sinks, etc.) that may be incorporated in the MOSFET device or a device package including the MOSFET device die.

As power MOSFET technology advances (i.e., devices shrink in size and channel density increases) the SOA of the MOSFET gets worse. The devices may have a high transconductance (e.g., due to high channel density (small cell pitch), short channel length, and thin gate oxide). A zero thermal coefficient (ZTC) point in the drain current ($I_D$) versus gate-to-source voltage (V) curve occurs at high $I_{DS}$, and thus increase the probability of operating below the ZTC (i.e., in the positive temperature coefficient region) and thus increases the probability of thermal failure of the device. The SOA of the MOSFET may be very sensitive to small variations in $V_{TH}$ that can cause the local hot spots. At least some of these small variations in $V_{TH}$ that can result in degradation of the SOA may be a result of geometric features (e.g., non-uniformities such as corners and bends in trenches and mesas) inherent in the geometric design of the structures of the MOSFET device.

In accordance with the principles of the present disclosure, the SOA of a MOSFET device is increased by reducing the gain of the MOSFET device for linear mode (saturation region) operation at low gate-source voltages ($V_{GS}$). For this purpose, the MOSFET device may include different active area portions with different $V_{TH}$ values for the device channels in the different portions. For example, the MOSFET device may include a first portion including regions (channel regions) associated with device channels having a low $V_{TH}$ and a second portion including regions (channel regions) associated with device channels having a high $V_{TH}$. In some example implementations, the different $V_{TH}$ values of the device channels associated with channel regions can be set by using correspondingly different PHV implants as channel implants. In some example implementations, the different $V_{TH}$ values of the of the device channels associated with the channel regions can be set using, for example, different gate oxide thicknesses in the different regions.

In saturation, at low $V_{GS}$ (e.g., at $V_{GS}$<high $V_{TH}$) only the first portion with the low $V_{TH}$ in the MOSFET may conduct current, resulting in low gain. The low gain may result in a smaller current and lower heat generation in the first portion. At high $V_{GS}$ (e.g., at $V_{GS}$>high $V_{TH}$) both the first portion with the low VTH and the second portion with the low $V_{TH}$ in the MOSFET may conduct current, resulting in high gain and a low Rds(on) for the device. The high gain may result in a larger current and higher heat generation in the second portion.

The geometrical distribution of the first portion (channel regions) associated with device channels having a low $V_{TH}$ and the second portion (channel regions) associated with device channels having a high $V_{TH}$ in the MOSFET device may be designed to achieve a uniform (or more uniform) temperature distribution across the active areas of the device. In example implementations, the geometrical distribution of channel regions with low $V_{TH}$ and channel regions with high $V_{TH}$ may be determined by consideration of a geometry of expected local hot spots in the MOSFET device and also consideration of a geometry of heat dissipation pathways in a device package including the MOSFET device die.

FIG. 1 shows, in plan view, a portion of an example device layout of a trench MOSFET device 100 including an active area with two different active area portions having different $V_{TH}$ values for the device channels in the two different portions.

Figure 2:
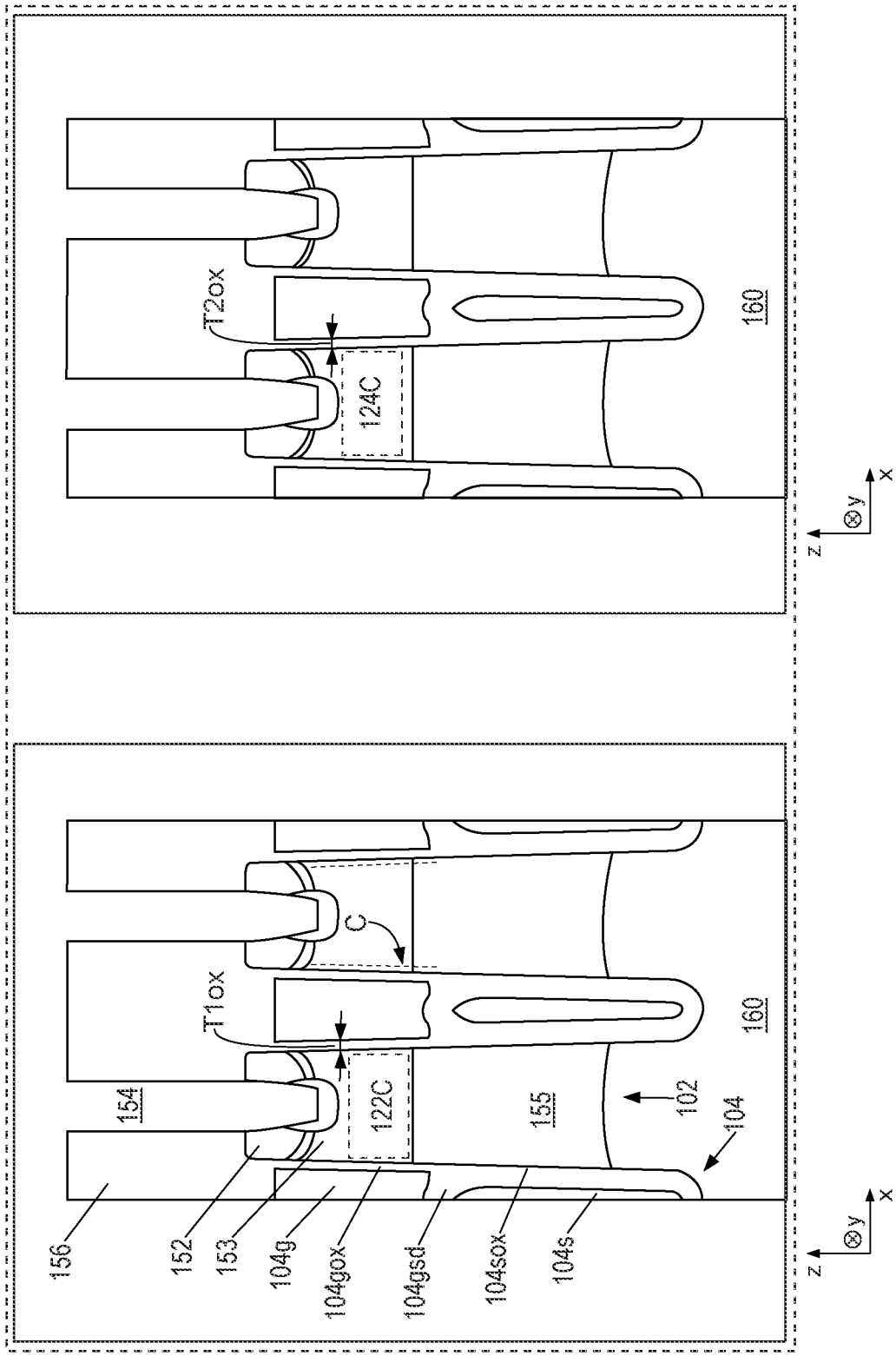
FIGS. 2A and 2B illustrate cross sectional views of the MOSFET device of FIG. 1.

MOSFET device 100 may include, for example, an active area 120 formed on a semiconductor substrate (e.g., semiconductor substrate 160, FIGS. 2A and 2B). Active area 120 may include a plurality of trenches 104 and mesas 102 formed in the semiconductor substrate and extending in a longitudinal direction (e.g., y direction). Trenches 104 may include, for example, the gate electrode and shield electrode (e.g., gate electrodes 104g and shield electrode 104s, FIGS. 2A and 2B) of the device. The gate electrode and shield electrode may extend along the lengths of trenches 104 (e.g., in the y direction). Mesas 102, which may include doped regions (e.g., source region 152, body region 153, channel region 122C, channel region 124C, source and body contact element 154, and drift region 155, etc., FIGS. 2A and 2B) for forming a device channel (e.g., device channel C) of the MOSFET device. The doped regions (e.g., may extend along the lengths of mesas 102 in portions of active area 120 (e.g., portion 122 and portion 124) (in the y direction).

As shown in FIG. 1, active area 120 includes two different active area portions (e.g., portion 122 and portion 124) having, for example, different threshold voltage ($V_{TH}$) values for the device channels associated with channel regions in the two different portions. Portions 122 and 124 may, for example, have a generally rectangular shape. Portion 122 may, for example, have a length 122L (e.g., in the y direction) and portion 124 may, for example, have a length 124L (e.g., in the y direction). In example implementations, portions 122 and 124 may be repeated one or more times, for example, alternately, (e.g., in the y direction) in active area 120. In example implementations, length 122L of a portion 122 may be the same as, greater than, or less than length 124L of a portion 124. The lengths of the portions (e.g., length 122L of portion 122, and length 124L of portion 122) may be the same as the lengths of the respective channel regions in the portions.

Channel regions (e.g., channel regions 122C, FIG. 2A) in active area portion 122 may be associated with device channels (e.g., device channels C) having a first threshold voltage value ($V_{TH}$), and channel regions (e.g., channel regions 124C, FIG. 2B) in active area portion 124 may be associated with device channels having a second threshold voltage value ($V_{TH}$). In example implementations, the first threshold voltage value ($V_{TH}$) (a low $V_{TH}$) may be smaller than the second threshold voltage value ($V_{TH}$) (a high $V_{TH}$). In example implementations, the first threshold voltage value ($V_{TH}$) (a low $V_{TH}$) in portion 122 may be smaller than the second threshold voltage value ($V_{TH}$) (a high $V_{TH}$) in portion 124.

In example implementations, the low $V_{TH}$ may have value in a range of about 0.5 volts to 3.5 volts (e.g., ~1.6V), the high $V_{TH}$ may have value in a range of about 1.5 volts to 6.5 volts range (e.g., ~4.0V) (e.g., depending on a second PHV implant dose in a body region of the).

A ratio of a sum of lengths 122L of all channel regions 122C having the first threshold voltage value ($V_{TH}$) over a length (e.g., length L) of a mesa 102 is proportional to a percentage of channel length in the mesa with a low threshold voltage ($V_{TH}$) value in the mesa. The percentage of channel length in the mesa with a low threshold voltage ($V_{TH}$) value may be between 0% and 100%. A ratio of a sum of lengths 124L of all channel regions 124C having the second threshold voltage value ($V_{TH}$) over the length L of mesa 102 is proportional to a percentage of channel length in the mesa with a high threshold voltage ($V_{TH}$) value. The percentage of channel length in the mesa with a high threshold voltage ($V_{TH}$) value may be between 0% and 100%.

FIGS. 2A and 2B show cross sectional views of MOSFET device 100 (taken at lines A-A and B-B in FIG. 1, respectively) in active area portion 122 and active area portion 124, respectively.

As shown in FIGS. 2A and 2B, MOSFET device 100 in both active area portion 122 and active area portion 124 include mesas 102 formed between parallel trenches 104 in a semiconductor substrate 160. Trenches 104 include a shield electrode 104s and a gate electrode 104g. Shield electrode 104s may be disposed below gate electrode 104g in trenches 104. A dielectric layer 104gsd may isolate shield electrode 104s from gate electrode 104g. Further, a gate oxide 104gox isolates gate electrode 104g and a shield oxide 104sox isolates shield electrode 104s in trenches 104 from mesas 102. Gate oxide 104gox may have a thickness T1ox (FIG. 2A) or a thickness T2ox (FIG. 2B).

Mesas 102 may, for example, include doped semiconductor regions (e.g., (e.g., source region 152, body region 153, source and body contact element 154, and drift region 155, etc.) for forming channels of the MOSFET device.

Top surfaces of MOSFET device 100 (surfaces of mesas 102 and trenches 104) may be covered by a protective dielectric layer 156.

As shown in FIG. 2A, the doped regions in mesa 102 may be used to form a channel region 122C in active area portion 122 of MOSFET device 100. Channel region 122C may be associated with a device channel C (e.g., formed at about the interface of gate oxide 104gox and body region 153). The first threshold voltage value ($V_{TH}$) (a low $V_{TH}$) corresponding to channel region 122C in active area portion 122 may be determined, for example, by a dopant concentration in body region 153 that is set (as previously discussed) by a first PHV implant and by thickness $T1_{ox}$ of gate oxide $104_{gox}$.

As shown in FIG. 2B, the doped regions in mesa 102 may be used to form a channel region 124C in active area portion 124 of MOSFET device 100. The second threshold voltage value ($V_{TH}$) (a high $V_{TH}$) of corresponding to channel region 124C in active area portion 124 may be determined, for example, by a dopant concentration in body region 153 that is set (as previously discussed) by a second PHV implant and by thickness $T2_{ox}$ of gate oxide $104_{gox}$. In some implementations, thickness $T2_{ox}$ may be equal to or greater than thickness $T1_{ox}$.

With reference to FIG. 1, current gains in active area portion 122 and active area portion 124 in MOSFET device 100 depend on the threshold voltage values ($V_{TH}$) in the two regions. The first threshold voltage value ($V_{TH}$) (a low $V_{TH}$) in active area portion 122 compared to the second threshold voltage value ($V_{TH}$) (a high $V_{TH}$) in active area portion 124 may make active area portion 122 an area of higher current gain than active area portion 124.

As noted previously, in example implementations, the geometrical distribution of channel regions with low $V_{TH}$ and channel regions with high $V_{TH}$ may be determined by consideration of a geometry of expected local hot spots in the MOSFET device and also consideration of a geometry of heat dissipation pathways in a device package including the MOSFET device die. The heat dissipation pathways in a device package including the MOSFET device die may be a function of the backend metallization structures (e.g., source metal, gate contacts, heat sinks, etc.) that may be incorporated in the MOSFET device die.

Figure 3:
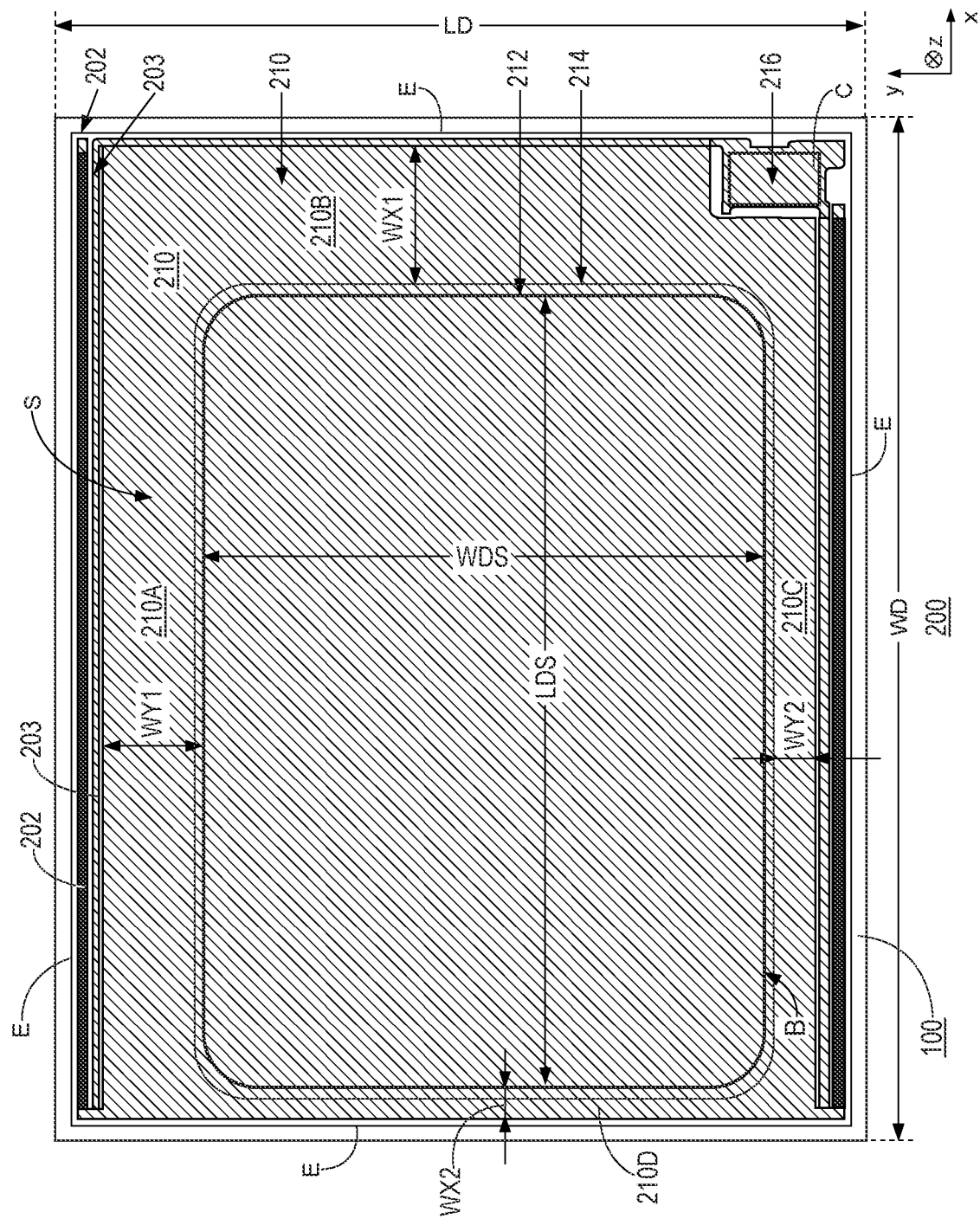
FIG. 3 illustrates, in plan view, metallization structures of an example MOSFET device die.

FIG. 3 shows, in plan view, metallization structures of an example MOSFET device die 200 including a MOSFET device (e.g., MOSFET device 100).

MOSFET device die 200 may have a generally rectangular shape with width WD and a length LD. The metallization structures of MOSFET device die 200 may include gate runners 203 disposed, for example, along edges E of the die, for contacting gate electrodes (e.g., gate electrodes 104g, FIGS. 2A and 2B) of the device. Gate runners 203 may lead to a gate pad 216 disposed, for example, at a corner CC of the die. The metallization structures may further include shield runners 202 disposed, for example, along edges E of the die, for contacting shield electrodes (e.g., shield electrodes 104s, FIGS. 2A and 2B) of the device. The metallization structures may further include a source metal 210 covering a top surface S of the die. Source metal 210 may contact source regions (e.g., source regions 152, FIGS. 2A and 2B) of the device. Source metal 210 may also contact shield runners 202 disposed along edges E of the die.

Source metal 210 may include a source pad 212 with an overlying solderable top metal (STM) layer 214. Source pad 212 may be adapted to receive a source clip connection to source leads of a device package. Source pad 212 may, for example, have a generally rectangular shape (e.g., a rounded rectangular shape) with width WS and a length LS. Source pad 212 may be located generally centrally or off-center on die 200. Source pad 212 may be a smaller size rectangle than MOSFET device die 200 (e.g., source pad width WS may be smaller than width WD of the die, and source pad length LS may be smaller than length LD of the die) leaving portions source metal 210 exposed (i.e., not covered by source pad 212). FIG. 3 shows, for example, portions (i.e., source metal strips 210A, 210B, 210C and 210D having widths LY1, WX1, LY2 and WX2) of source metal 210 that are not covered by source pad 212. In FIG. 3, source metal strips 210A, 210B, 210C, and 210D are shown, for example, as being disposed in sequence on a periphery (boundary B) of source pad 212, i.e., on sides of source pad 212 in a clockwise fashion beginning with a top side of source pad 212.

Gate pad 216 may be configured for example, for wire bonding a connection wire (not shown) between MOSFET device die 200 and a lead frame in a chip package (not shown). Further, source pad 212 may be configured to receive a clip connection (not shown) between MOSFET device die 200 and source leads of a lead frame in the chip package (not shown). Source pad 212 and the clip connection may provide a thermal pathway for dissipating heat generated by MOSFET device 100 (in die 200) to outside of the package.

In the example shown in FIG. 3, a single source pad 212 has a rectangular shape. In some example implementations, the source pad may have other shapes, for example, a polygonal shape, an oval shape, a circular shape, or an L-shape. In some example implementations, there may be multiple source pads disposed on the device die surface.

Example implementations of the techniques of having different channel regions with different VTH for increasing the SOA of MOSFET device 100 described herein may consider the specific geometry of the metallization structures of MOSFET device die 200 described, for example, in FIG. 3.

In example implementations, the device may include mesas (e.g., mesa 102, FIG. 1, FIG. 4B) extending in a longitudinal direction through the active area of the device. The mesa may include a channel region extending in a longitudinal direction with the channel region including low threshold voltage channel portions and high threshold voltage channel portions. A first active area portion of the device corresponding to a first specific geometry feature of the metallization structures may include the channel portions in a first ratio (proportion) of low threshold voltage channel portions to high threshold voltage channel portions, and a second active area portion corresponding to a second specific geometry feature of the metallization structures may include the channel portions in a second ratio (proportion) of low threshold voltage channel portions to high threshold voltage channel portions, The first ratio may be larger than the second ratio.

Figure 4A:
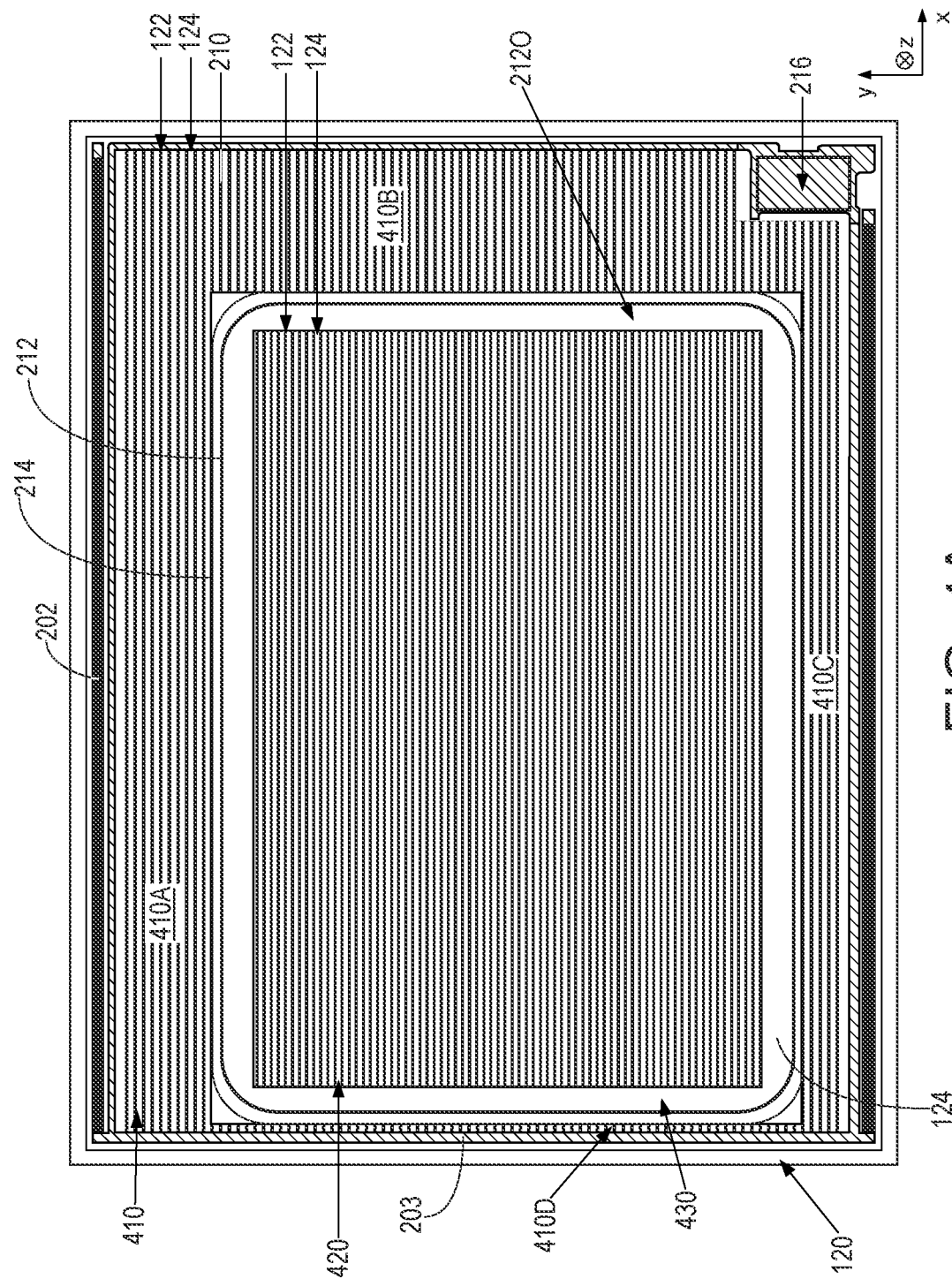
FIG. 4A illustrates, in plan view, an example device layout of the MOSFET device of FIG. 1 in consideration of the specific geometry of the metallization structures shown in FIG. 3.

FIG. 4A shows, for example, in plan view, an example device layout of trench MOSFET device 100 in consideration of the specific geometry of the metallization structures of MOSFET device die 200. Different areas of the device layout of trench MOSFET device 100 corresponding to different features of the specific geometry of the metallization structures may have different ratios of high $V_{TH}$ to low $V_{TH}$ channel regions in the different areas.

As shown in FIG. 4A, trench MOSFET device 100 may include an active area 120 with at least two different active area portions having correspondingly different ratios of $V_{TH}$ values for the device channels associated with channel regions (e.g., channel regions 122C and 124C, FIGS. 2A and 2B) in the two different active area portions.

In some example implementations, trench MOSFET device 100 may, for example, include a first active area portion 410 and a second active area portion 420. First active area portion 410 may surround (or at least partially surround) second active area portion 420. For example, second active area portion 420 may geometrically correspond to portions covered by source pad 212 and first active area portion 410 may geometrically correspond to portions of source metal 210 surrounding source pad 212 (e.g., to source metal strips 210A, 210B, 210C and 210D, FIG. 3) that are not covered by source pad 212. In example implementations, first active area portion 410 may include strips 410A, 410B, 410C and 410D that correspond to source metal strips 210A, 210B, 210C and 210D of source metal 210 (FIG. 3), respectively.

In example implementations, active area portion 410 that geometrically correspond to portions of source metal 210 outside source pad 212 (where there may not be good thermal pathways for heat dissipation to the outside of a device package) may include a high percentage of high $V_{TH}$ channel regions (e.g., portion 124, FIG. 1) and a low percentage of low $V_{TH}$ channel regions (e.g., portion 122, FIG. 1).

In other words, low threshold voltage channel portions may occupy a first area of the first active area portion, and the high threshold voltage channel portions may occupy to a second area of the first active area portion. In example implementations, the first area may, for example, be smaller than second area.

In example implementations, the high percentage of high $V_{TH}$ channel regions outside source pad 212 may be about—75%. The low percentage of high $V_{TH}$ channel regions outside source pad 212 may be about—25%. The high percentage of high $V_{TH}$ channel regions in active area portion 410 may result in a lower current gain in the portions of source metal 210 outside source pad 212. The lower current gain may limit potential temperature increases and make any temperature increases manageable even with the limited thermal pathways for heat dissipation from the portions of source metal 210 outside source pad 212.

In example implementations, active area portion 420 corresponding to source pad 212 may include a high percentage of low $V_{TH}$ channel regions (e.g., portion 122, FIG. 1) and a low percentage of high $V_{TH}$ channel regions (e.g., portion 124, FIG. 1) under source pad 212 (where there can be a good thermal pathway for heat dissipation through a source clip connection in a chip package). In example implementations, the high percentage of low $V_{TH}$ channel regions under source pad 212 may be about—50%. The high percentage of low $V_{TH}$ channel regions in active area portion 420 may result in a higher current gain under source pad 212. The potential temperature increases under source pad 212 due to the higher current gain may be manageable due to the good thermal pathway for heat dissipation formed by a source clip connection to source pad 212 in a chip package.

In device operations, under saturation condition, more current will flow in active area portion 420 under the source connection clip with better thermal pathways for heat dissipation to outside the chip package, and less current will flow in active area portion 410 corresponding to peripheral regions with poor thermal pathways for heat dissipation to outside the chip package.

In some example implementations, trench MOSFET device 100 may further include, for example, a third active area portion 430 geometrically corresponding to a border portion 2120 of source pad 212. Third active area portion 430 may be disposed along the boundaries of source pad 212. Third active area portion 430 may include a high percentage of high $V_{TH}$ channel regions (e.g., portion 124, FIG. 1). In example implementations, the high percentage of high $V_{TH}$ channel regions in third active area portion 430 corresponding to border portion 2120 may be in a range of about 75% to 100% (e.g.,~100%). The high percentage of high $V_{TH}$ channel regions in third active area portion 430 may suppress current gain in border portion 2120 and avoid or alleviate current crowding at edges of the source clip connection to source pad 212.

Figure 4B:
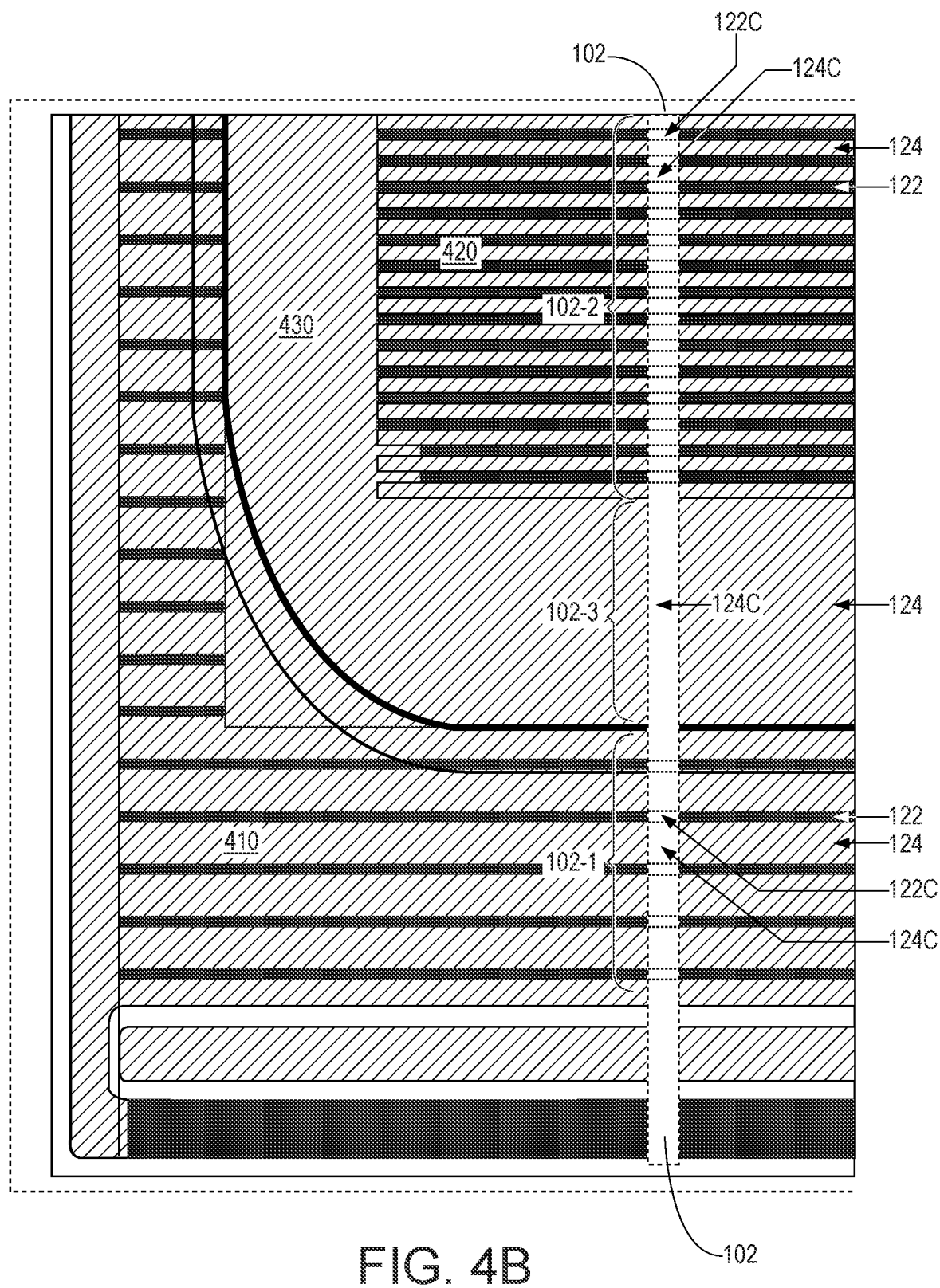
FIG. 4B illustrates a portion of the example device layout of FIG. 4A.

FIG. 4B shows an enlarged view of a portion of the device layout of trench MOSFET device 100 shown in FIG. 4A. FIG. 4B, like FIG. 4A, shows trench MOSFET device 100 including first active area portion 410 (surrounding source pad 212) including a high percentage of high $V_{TH}$ channel regions (e.g., portion 124, FIG. 1) and a low percentage of low $V_{TH}$ channel regions (e.g., portion 122, FIG. 1), second active area portion 420 (covered by source pad 212) including a high percentage of low $V_{TH}$ channel regions (e.g., portion 122, FIG. 1) and a low percentage of high $V_{TH}$ channel regions (e.g., portion 124, FIG. 1) under source pad 212, and third active area portion 430 (corresponding border portion 2120 of source pad 212) including a high percentage of high $V_{TH}$ channel regions. For purposes of illustration, FIG. 4B shows one of the mesas 102 (FIG. 1) of device 100 that underlie the device layout shown in FIG. 4A and FIG. 4B. In the example shown in FIG. 4B, mesa 102 may include mesa segments 102-1, 102-2 and 102-3 underlying first active area portion 410, second active area portion 420, and third active area portion 430, respectively. Mesas 102 can include the low $V_{TH}$ channel regions (e.g., channel region 122C, FIG. 2A) and the high $V_{TH}$ channel regions (e.g., channel region 124C, FIG. 2B) in different proportions (or ratios) along lengths of the mesa in the different active area portions. For example, mesa segment 102-1 may include a high percentage of high $V_{TH}$ channel regions 124C and a low percentage of low $V_{TH}$ channel regions 122C to give first active area portion 410 its low current gain characteristics.

Mesa segment 102-2 may include a low percentage of high $V_{TH}$ channel regions 124C and a high percentage of low $V_{TH}$ channel regions 122C to give second active area portion 410 its high current gain characteristics. Mesa segment 102-3 may include a high percentage of high $V_{TH}$ channel regions 124C to give third active area portion 410 its characteristics of alleviating current crowding.

Figure 5:
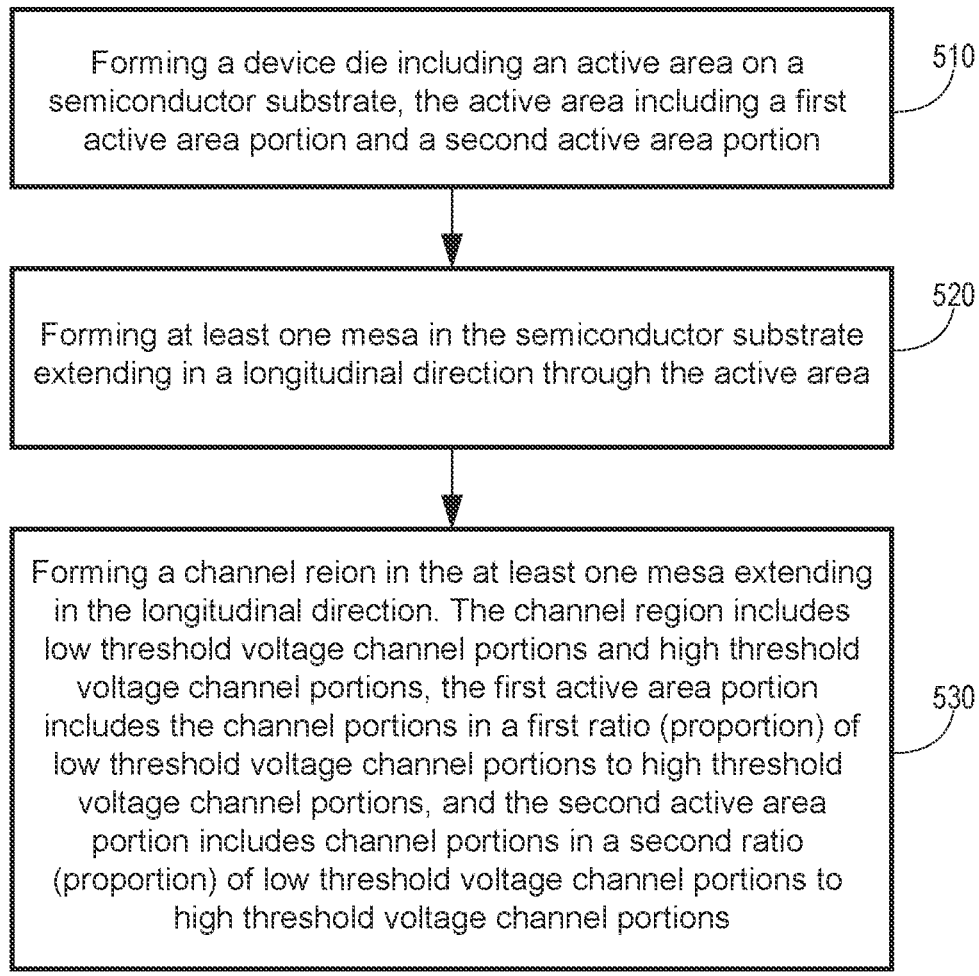
FIG. 5 illustrates an example method for increasing a safe operating area (SOA) of a trench MOSFET device.

FIG. 5 shows an example method for varying current gain across different geometric areas of a MOSFET device die to increase the SOA of the device (e.g., in saturation mode operation).

Method 500 includes forming a device die including an active area on a semiconductor substrate (510). The active area includes a first active area portion and a second active area portion. The method further includes forming at least one mesa in the semiconductor substrate extending in a longitudinal direction through the active area (520), and forming a channel region in the at least one mesa extending in the longitudinal direction (530). The channel region includes low threshold voltage channel portions and high threshold voltage channel portions, the first active area portion includes the channel portions in a first ratio (proportion) of low threshold voltage channel portions to high threshold voltage channel portions, and the second active area portion includes channel portions in a second ratio (proportion) of low threshold voltage channel portions to high threshold voltage channel portions. The first ratio is larger than the second ratio.

Specific structural and functional details disclosed herein are merely representative for purposes of describing example embodiments. Example embodiments, however, be embodied in many alternate forms and should not be construed as limited to only the embodiments set forth herein.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A MOSFET device die, comprising:
   an active area including a first active area portion and a second active area portion formed on a semiconductor substrate; and
   at least one mesa formed in the semiconductor substrate extending in a longitudinal direction through the active area, the at least one mesa including a channel region extending in a longitudinal direction, the channel region including low threshold voltage channel portions and high threshold voltage channel portions,
   the first active area portion including the channel portions in a first ratio of low threshold voltage channel portions to high threshold voltage channel portions, and
   the second active area portion including channel portions in a second ratio of low threshold voltage channel portions to high threshold voltage channel portions,
   wherein the first ratio is larger than the second ratio.

2. The MOSFET device die of claim 1, wherein the low threshold voltage channel portions have a threshold voltage in a range of about 0.5 volts to about 3.5 volts, and the high threshold voltage channel portions have a threshold voltage in a range of about 1.5 volts to about 6.5 volts.

3. The MOSFET device die of claim 1, wherein low threshold voltage channel portions occupy a first area of the first active area portion, and the high threshold voltage channel portions occupy to a second area of the first active area portion, and wherein the first area is greater than second area.

4. The MOSFET device die of claim 3, wherein the first active area portion has a higher current gain than a current gain of the second active area portion at an applied voltage.

5. The MOSFET device die of claim 1, wherein the first active area portion underlies a source pad region on a surface of die.

6. The MOSFET device die of claim 5, wherein the source pad region on the surface of die is adapted to receive a source clip connection to source leads of a device package.

7. The MOSFET device die of claim 1, wherein the second active area portion underlies a periphery of a source pad region on a surface of the die.

8. The MOSFET device die of claim 1, wherein the second active area portion includes only high threshold voltage channel portions.

9. The MOSFET device die of claim 1, wherein the active area further include a third active area portion including only high threshold voltage channel portions, the third active area portion being disposed between the first active area portion and the second active area portion.

10. The MOSFET device die of claim 9, wherein the third active area portion is disposed along boundaries of a source pad region on a surface of the die.

11. The MOSFET device die of claim 1, wherein the channel region is formed in a body region in the mesa, the body region including a body region portion with a first dopant concentration and a body region portion with a second dopant concentration, the second dopant concentration being higher than the first dopant concentration, and wherein the low threshold voltage channel portions are formed in the body region portion with a first dopant concentration and the high threshold voltage channel portions are formed in the body region portion with the second dopant concentration.

12. The MOSFET device die of claim 1, wherein the low threshold voltage channel portions are formed in a first body region portion isolated from a gate electrode by a gate oxide layer having a first oxide thickness, and the high threshold voltage channel portions are formed in a second body region portion isolated from the gate electrode by a gate oxide layer having a second oxide thickness.

13. The MOSFET device die of claim 12, wherein the second oxide thickness is greater than the first oxide thickness.

14. A method, comprising:
   forming a device die including an active area on a semiconductor substrate, the active area including a first active area portion and a second active area portion;
   forming at least one mesa in the semiconductor substrate extending in a longitudinal direction through the active area; and
   forming a channel region in the at least one mesa extending in the longitudinal direction, the channel region including low threshold voltage channel portions and high threshold voltage channel portions,
   the first active area portion including the channel portions in a first ratio of low threshold voltage channel portions to high threshold voltage channel portions, and
   the second active area portion including channel portions in a second ratio of low threshold voltage channel portions to high threshold voltage channel portions,
   wherein the first ratio is larger than the second ratio.

15. The method of claim 14, wherein the low threshold voltage channel portions have a threshold voltage in a range of about 0.5 volts to about 3.5 volts, and the high threshold voltage channel portions have a threshold voltage in a range of about 1.5 volts to about 6.5 volts.

16. The method of claim 14, wherein low threshold voltage channel portions occupy a first area of the first active area portion, and the high threshold voltage channel portions occupy a second area of the first active area portion, and wherein the first area is greater than second area.

17. The method of claim 14, wherein forming the channel region includes forming the channel region in a body region in the mesa, forming the low threshold voltage channel portions in a body region portion with a first dopant concentration, and forming the high threshold voltage channel portions in a body region portion with a second dopant concentration, the second dopant concentration being higher than the first dopant concentration.

18. The method of claim 14, further comprising, disposing a source pad region on a surface of the die in contact with the first active area portion, the source pad region being adapted to receive a source clip connection to source leads of a device package.

19. The method of claim 14, wherein the second active area portion underlies a periphery of a source pad region on a surface of the die.

20. The method of claim 14, further comprising, forming a third active area portion including only high threshold voltage channel portions, the third active area portion being disposed between the first active area portion and the second active area portion.

* * * * *